United States Patent [19]

Nagahashi et al.

[11] Patent Number: 4,953,127

[45] Date of Patent: Aug. 28, 1990

[54] SEMICONDUCTOR MEMORY HAVING DIFFERENT READ AND WRITE WORD LINE VOLTAGE LEVELS

[75] Inventors: Yasuhiko Nagahashi; Yasuhiko Rai, both of Tokyo, Japan

[73] Assignee: NEC Corporation, Tokyo, Japan

[21] Appl. No.: 110,823

[22] Filed: Oct. 21, 1987

[30] Foreign Application Priority Data

Oct. 21, 1986 [JP] Japan .................. 61-251013

[51] Int. Cl.$^5$ .............................. G11C 7/00
[52] U.S. Cl. ................... 365/189.05; 365/230.06; 365/226; 365/190
[58] Field of Search ............ 365/190, 205, 207, 208, 365/226, 228, 230, 181, 233, 189.05, 230.06

[56] References Cited

U.S. PATENT DOCUMENTS

| | | | |
|---|---|---|---|
| 4,189,782 | 2/1980 | Dingwall | 365/190 |
| 4,536,859 | 8/1985 | Kamuro | 365/190 |
| 4,563,754 | 1/1986 | Aoyama et al. | 365/203 |
| 4,751,683 | 6/1988 | Wada et al. | 365/230 |

FOREIGN PATENT DOCUMENTS 0160390 12/1980 Japan .................. 365/190

Primary Examiner—Glenn Gossage
Attorney, Agent, or Firm—Sughrue, Mion, Zinn, Macpeak & Seas

[57] ABSTRACT

A Static Random Access Memory (SRAM) has a word line driving circuit responsive to a mode signal representative of a read-out mode or a write-in mode for supplying one of the word lines coupled to an accessed memory cell with a higher voltage level in the write mode than in the read mode. Each memory cell has a pair of memory transistors turned on or off in a complementary manner depending upon a data bit memorized therein and a pair of transfer transistors respectively coupled between the memory transistors and a pair of bit lines and gated by the word line. Each memory transistor has a decreased gate width by virtue of the word line driving circuit capable of producing the high or low voltage level, thereby allowing each memory cell to occupy a small area of the semiconductor substrate.

9 Claims, 9 Drawing Sheets

PRIOR-ART

PRIOR-ART

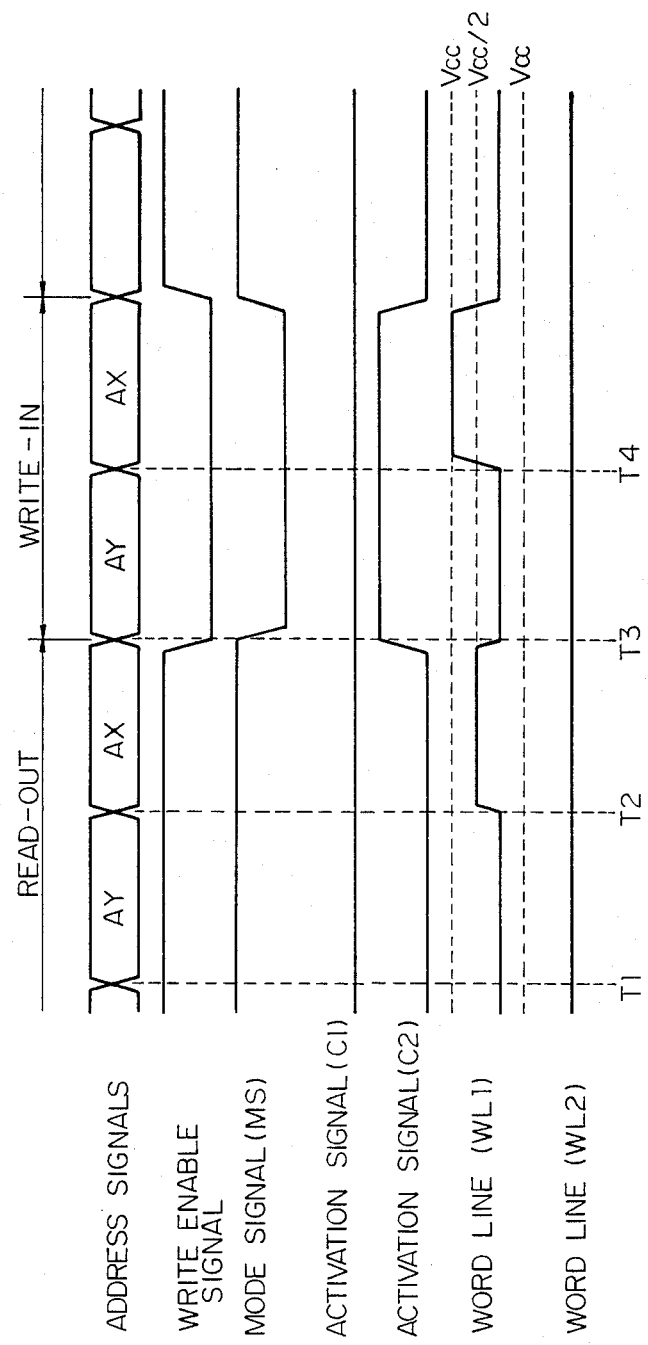

SEMICONDUCTOR MEMORY HAVING DIFFERENT READ AND WRITE WORD LINE VOLTAGE LEVELS

FIELD OF THE INVENTION

This invention relates to a semiconductor memory device and, more particularly, to a static type random access memory device fabricated on a semiconductor substrate.

BACKGROUND OF THE INVENTION

A known semiconductor memory device which is fabricated on a semiconductor substrate is illustrated in FIG. 1. The prior-art semiconductor memory device comprises a memory cell array 1 having a plurality of memory cells arranged in rows and columns, a row address buffer circuit 2 temporarily storing a row address signal AX consisting of a plurality of bits, a row address decoder circuit 3 decoding the row address signal AX supplied from the row address buffer circuit 2, and a plurality of word lines WL1 and WL2 extending in row direction. Each of the memory cells in the memory cell array 1 has a circuit arrangement shown in FIG. 2. All of the memory cells are similar in circuit arrangement to one another so only one memory all will be described in detail.

The memory located at the upper end of the left side comprises a pair of load resistors 4 and 5 each connected at one of the ends thereof to a source of positive voltage Vcc, a pair of n-channel type memory transistors 6 and 7 having source-drain paths respectively coupled between the other ends of the load resistors 4 and 5 and the ground terminal and gate electrodes respectively coupled to the other ends of the load resistors 5 and 4, and a pair of n-channel type transfer gate transistors 8 and 9 having source-drain paths respectively coupled between the other ends of the load resistors 4 and 5 and a pair of bit lines D0 and DB0 and gate electrodes coupled to the word line WL1. The other ends of the load resistors 4 and 5 serve as memory nodes, the voltage levels of which represent either logic "0" or logic "1". The gate electrodes of the transfer gate transistors 8 and 9 are thus coupled to the word line WL1 so that the memory nodes 10 and 11 are electrically connected to the bit lines D0 and DB0 through the transfer gate transistors 8 and 9 upon activation of word line WL1 by means of the row address decoder circuit 3. As described in U.S.P. 3,539,839, it is necessary to select the memory transistors 6 and 7 larger in on-resistance than the transfer gate transistors 8 and 9 so as to prevent the data bit stored therein from destruction. For this reason, each of the memory transistors 6 and 7 and each of the transfer gate transistors 8 and 9 have respective gate widths which are in the ratio 4 : 1.

The prior-art semiconductor memory device illustrated in FIG. 1 further comprises a column address buffer circuit 12 temporarily storing a column address signal AY consisting of a plurality of bits, a column address decoder circuit 13 operative to decode the column address signal AY supplied from the column address buffer circuit 12, plural pairs of bit lines D0 and DB0 and D1 and DB1 extending in a column direction and plural pairs of n-channel type transfer gate transistors 14, 15, 16 and 17. The bit lines D0 and DB0 are coupled at one of their ends to the source of positive voltage Vcc through load resistors 18 and 19, respectively, and at the other ends thereof to a pair of data lines DL and DBL through respective source-drain paths of the transfer gate transistors 14 and 15, respectively. Similarly, bit lines D1 and DB1 are coupled at one of their ends thereof to the source of positive voltage Vcc through load resistors 20 and 21, respectively, and at the other ends thereof to the data lines DL and DBL through respective source-drain paths of the transfer gate transistors 16 and 17, respectively. The data lines DL and DBL are coupled to a write-in circuit 22 and a read-out circuit 23 which in turn are respectively coupled to a data input terminal 24 and a data output terminal 25. The write-in circuit 22 and the read-out circuit 23 are selectively activated by a control circuit 26 depending upon the voltage level of a write enable signal WE.

In operation, when a new data bit is to be read out from the memory cell located at the upper end of the left side a control device such as a microprocessor provides a row address signal AX and a column address signal AY specifying the memory cell at the upper end of the left side. When the row address signal AX is stored in the row address buffer circuit 2, the row address decoder circuit 3 makes the word line WL1 go up to the active high voltage level Vcc, so that all of the transfer gate transistors coupled to the word line WL1 turn on. Then, the data bits stored in the memory cells appear on the respective bit line pairs in the form of complementary voltage levels. When the column address signal AY is stored in the column address buffer circuit 12, the column address decoder circuit 13 causes the transfer gate transistors 14 and 15 to turn on. Then, the data bit appearing on the bit line pair D0 and DB0 is transferred to the data lines DL and DBL. When the write enable signal WE is in the high level, the control circuit 26 activates the read-out circuit 23 so that the data bit read out from the memory cell at the upper end of the left side appears at the data output terminal 25 in the form of a single voltage level.

On the other hand, when a new data bit should be written into the memory cell at the upper end of the left side, a new data bit is supplied from the external device to the data input terminal 24. A row address signal AX and a column address signal AY similar to those supplied in the read-out mode, are supplied to address buffers 2 and 12, respectively. Then, the row address decoder circuit 3 causes the word line WL1 to go up to the active high level Vcc to turn on the transfer gate transistors coupled to the word line WL1, and the column address decoder circuit 13 causes the transfer gate transistors 14 and 15 to turn on to allow the data lines DL and DBL to electrically connect to the bit lines D0 and DB0. In the write-in mode, the write enable signal WE goes down to the active low level so that the write-in circuit 22 is activated. Upon appearance of a new data bit at the data input terminal, the write-in circuit 22 converts the new data bit into the complementary voltage levels which are put on the data lines DL and DBL. The transfer gate transistors 14 and 15 have already turned on so that the new data bit in the form of complementary voltage levels is transferred to the bit lines D0 and DB0. The new data bit transferred to the bit lines D0 and DB0 passes through the transfer gate transistors 8 and 9 and reaches the memory nodes 10 and 11. Upon storing the new data bit in the form of complementary voltage levels into the memory nodes 10 and 11, the memory transistors 6 and 7 may turn on and off in accordance with the new data bit. Namely, if the new data bit is equal in logic level to the previous data bit, the memory transistors 6 and 7 are not changed, but when the new data bit is different from the previous data bit, the memory transistors 6 and 7 may be shifted from the on-state to the off-state and vice versa, respectively.

Thus, the row address decoder circuit 3 incorporated in the prior-art semiconductor device causes one of the word lines to go up to the positive voltage level Vcc upon both of the write-in operation and the read-out operation. However, a problem is encountered in the prior-art semiconductor device in that each of the memory cells occupies a large amount of real estate on the semiconductor substrate. This is because of the fact that the memory transistors 6 and 7 have wide gate electrodes which are four times wider than those of the transfer gate transistors 8 and 9.

SUMMARY OF THE INVENTION

It is therefore an important object of the present invention to provide a semiconductor memory device which has memory cells greater in number than the prior-art semiconductor memory device.

It is also an important object of the present invention to provide a semiconductor memory device which has a memory cell array occupying a relatively small amount of real estate on a semiconductor substrate.

It is also an important object of the present invention to provide a semiconductor memory device which has memory cells greater in number than the prior-art semiconductor memory device but occupying a relatively small amount of real estate on a semiconductor substrate.

It is also an important object of the present invention to provide a semiconductor memory device which allows a data bit to be read out therefrom or written therein at an high speed.

It is also an important object of the present invention to provide a semiconductor memory device which is free from destruction of stored data bits.

To accomplish these objects, the present invention proposes to provide a relatively high or a relatively low voltage level to a selected word line depending upon the operation mode.

In accordance with the present invention, there is provided a semiconductor memory device fabricated on a semiconductor substrate and having operation modes consisting of a read-out mode and a write-in mode, comprising (a) a plurality of word lines each extending in a row direction, (b) a plurality of bit lines each extending in a column direction, (c) a plurality of complementary bit lines each extending in a column direction and paired with one of said bit lines to form a plurality of bit line pairs, (d) a memory cell array having a plurality of memory cells arranged in rows and columns, each of the memory cells having two memory nodes where a data bit is stored in the form of complementary voltage levels, two transfer gate transistors having source-drain paths coupled between the memory nodes and the bit line pair and gate electrodes coupled to one of the word lines, and a data bit two memory nodes, (e) a word line specifying circuit operative to select one word line based on a row address signal, (f) a word line driving circuit operative to supply the one word line with a relatively high voltage level or a relatively low voltage level depending upon the operation modes, g) data input/output means where the data bit appears, (h) a bit line pair specifying circuit operative to select one bit line pair for allowing the one bit line pair to electrically connect to the data input/output means, and (i) a control circuit operative to produce a mode signal representing the read-out mode or the write-in mode.

The data bit retaining circuit may comprise two resistors coupled between the memory nodes and a first constant voltage source, respectively, and two memory transistors one of which has a source-drain path coupled between one of the memory nodes and a second constant voltage source different in voltage level from the first constant voltage source and a gate electrode coupled to the other of the memory nodes and the other of which has a source-drain path coupled between the other of the memory nodes and the second constant voltage source and a gate electrode coupled to the one of the memory nodes, and each transfer gate transistor and each memory transistor may have first and second gate widths, respectively, which are in a ratio 1 : 0.8 to 1 : 1.2.

In another implementation, the semiconductor memory device may further comprise a plurality of data latch circuits each coupled to one of the bit line pairs and operative to store the data bit appearing on the bit line pair upon activation, and a latch selecting circuit operative to activate said data latch circuits except for the data latch circuit coupled to the bit line pair specified by the bit line pair specifying circuit.

BRIEF DESCRIPTION OF THE DRAWINGS

The features and advantages of a semiconductor memory device according to the present invention will be more clearly understood from the following description taken in conjunction with the accompanying drawings in which:

FIG. 7 is a graph showing the waveforms of signals appearing at the essential nodes of the semiconductor memory device illustrated in FIG. 3.

DESCRIPTION OF THE PREFERRED EMBODIMENTS

First Embodiment

Figure 1:
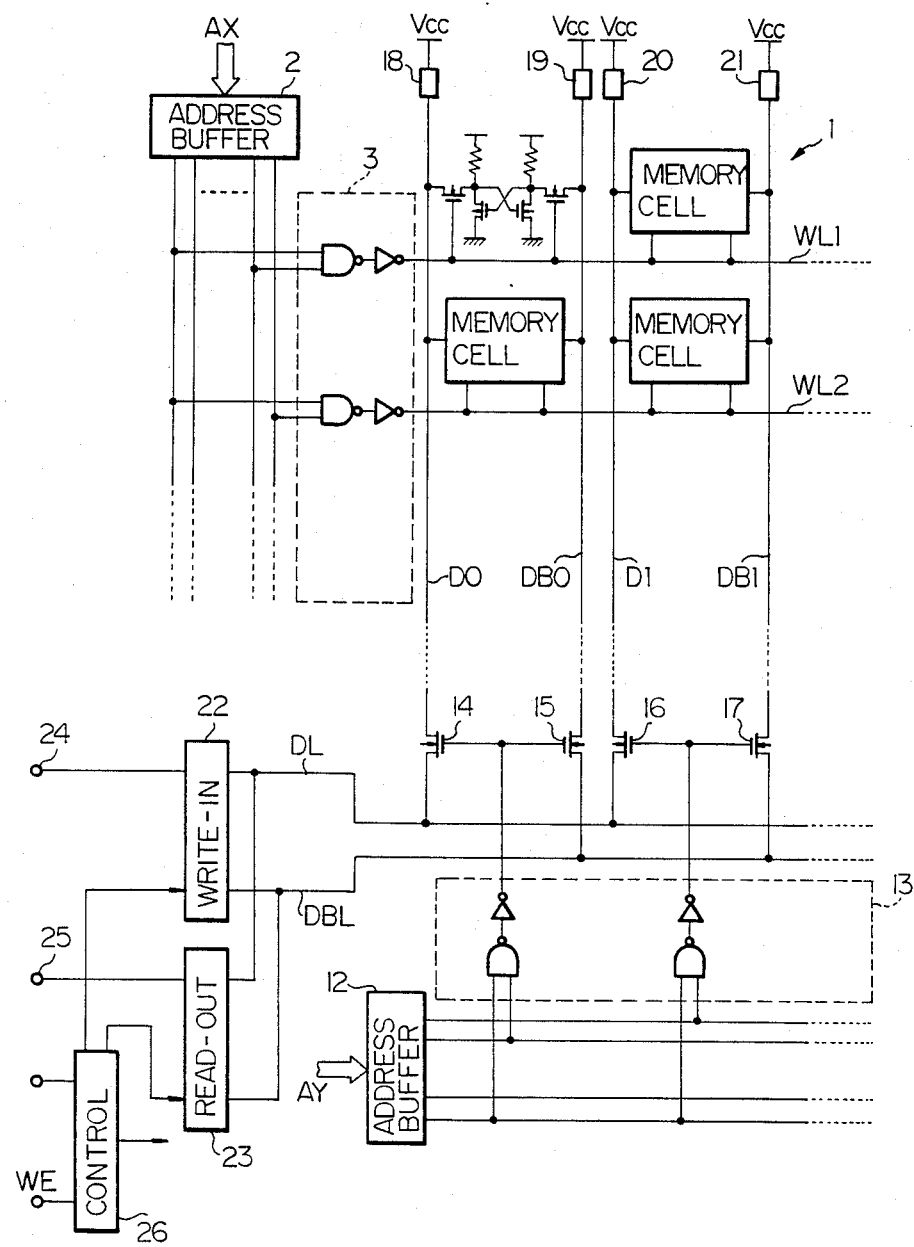
FIG. 1 is a block diagram showing the circuit arrangement of a prior-art semiconductor memory device.
Figure 2:
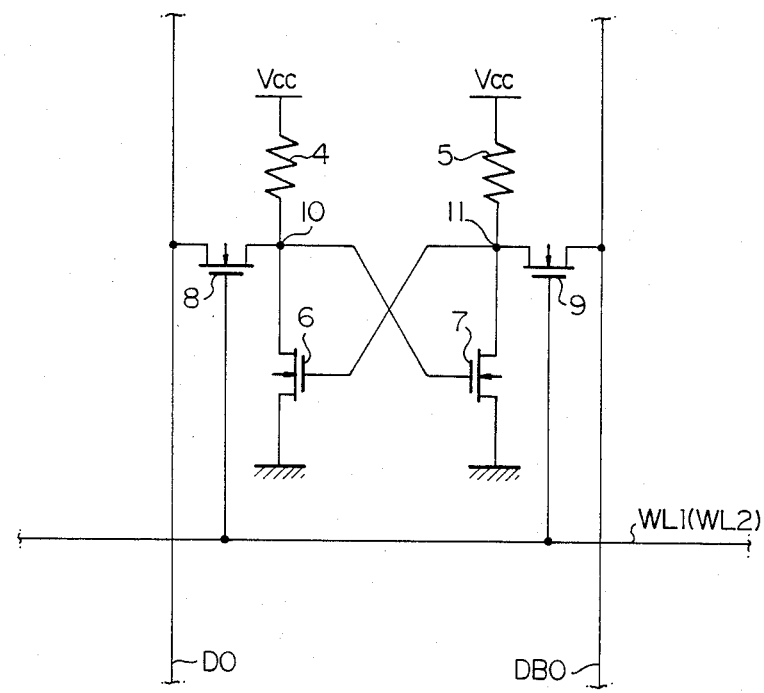
FIG. 2 is a circuit diagram showing the arrangement of the memory cell incorporated in the prior-art semiconductor memory device illustrated in FIG. 1.
Figure 3:
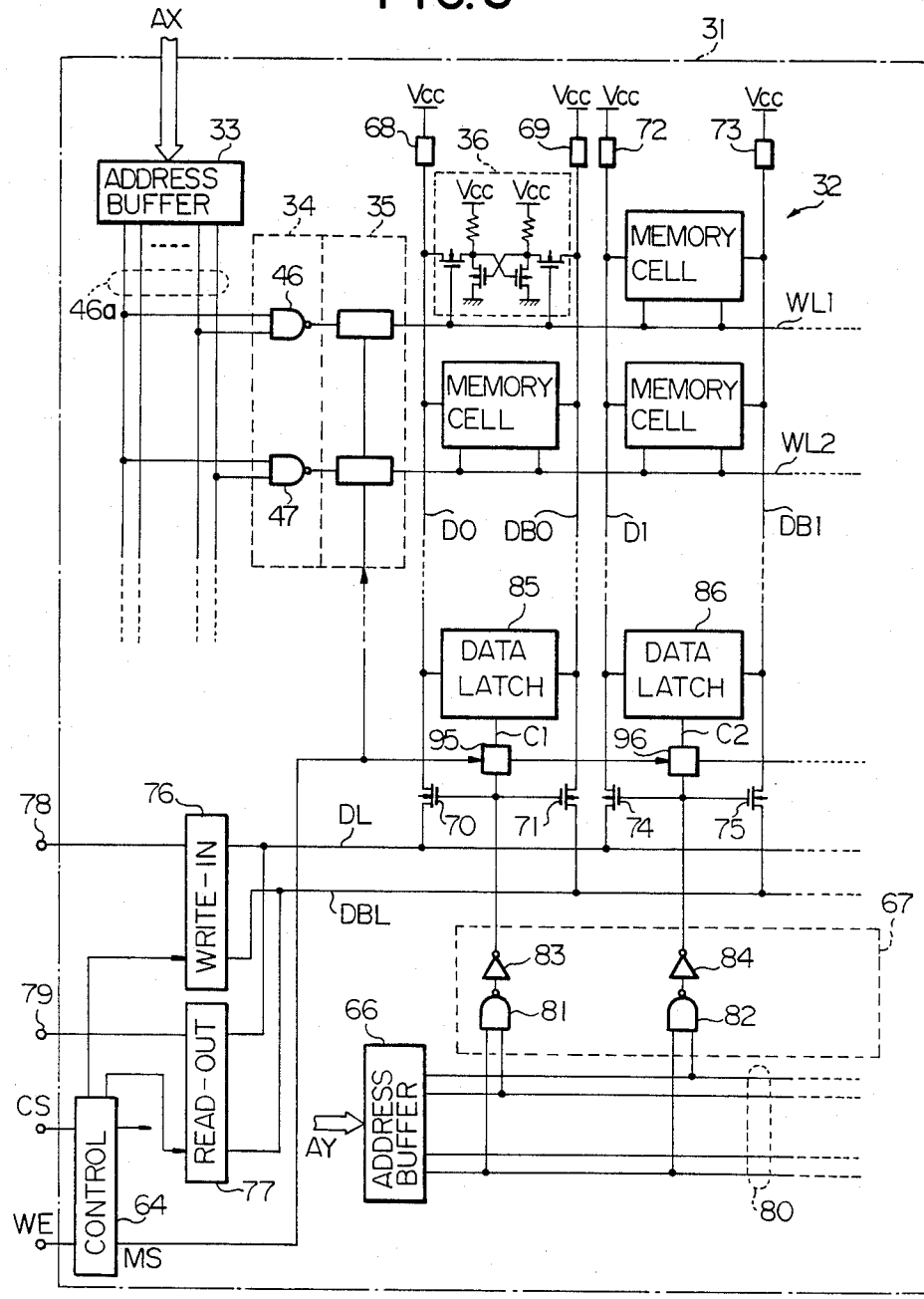
FIG. 3 is a block diagram showing the arrangement of a preferred embodiment of the present invention.

Referring to FIG. 3 of the drawings, the circuit arrangement of a semiconductor memory device embodying the present invention is illustrated. The semiconductor memory device illustrated in FIG. 3 is fabricated on a semiconductor substrate 31 and comprises a memory cell array 32 having a plurality of memory cells arranged in rows and columns, a row address buffer circuit 33 temporarily storing a row address signal AX consisting of a plurality of bits, a row address decoder circuit 34 decoding the row address signal on output lines 46a supplied from the row address buffer circuit 33, a word line driving circuit 35 producing a first activation signal of a positive high voltage level Vcc and a second activation signal of a half of the positive high voltage level Vcc/2, and a plurality of word lines including word lines WL1 and WL2 extending in the row direction.

Figure 4:
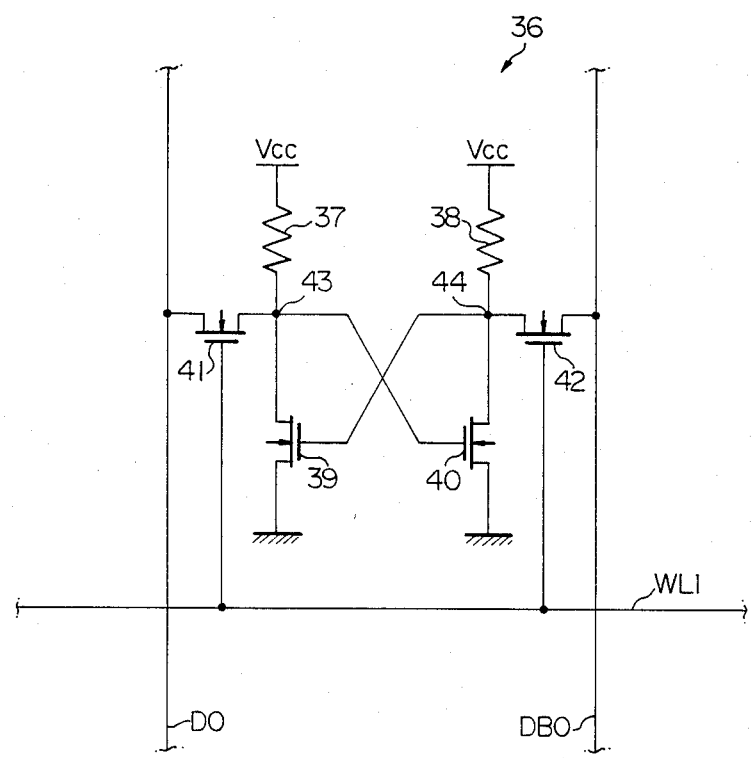
FIG. 4 is a circuit diagram showing the arrangement of the memory cell device incorporated in the semiconductor memory device illustrated in FIG. 3.

Each of the memory cells in the memory cell array 32 has a circuit arrangement shown in FIG. 4. All of the memory cells are similar in circuit arrangement to one another so that the description is focused on the memory cell located at the upper end of the left side (which is designated by reference numeral 36). The other memory cells are not described in detail for the sake of simplicity. The memory cell 36 comprises a pair of load resistors 37 and 38, two memory transistors 39 and 40 and two transfer gate transistors 41 and 42. The load resistors are connected at one of the ends thereof to a source of positive voltage Vcc and provide certain resistances which are equal to each other. The other ends of the load resistors 37 and 38 serve as memory nodes 43 and 44 and store a data bit of logic "0" level or logic "1" level in the form of complementary voltage levels. The two memory transistors 39 and 40 are formed by n-channel type MOS field effect transistors and have respective source-drain paths coupled between the memory nodes 43 and 44 and a ground terminal and gate electrodes respectively coupled to the memory nodes 44 and 43. On the other hand, the transfer gate transistors 41 and 42 are formed by n-channel type MOS field effect transistors and have source-drain paths respectively coupled between the memory nodes 43 and 44 and a bit line of a bit line pair consisting of a bit line D0 and a complementary bit line DB0 and gate electrodes coupled to the word line WL1. The gate electrodes of the transfer gate transistors 41 and 42 are thus coupled to the word line WL1 so that the memory nodes 43 and 44 are electrically connected to the bit line pair D0 and DB0 through the transfer gate transistors 41 and 42 when the first activation signal or the second activation signal is applied to the word line WL1. The memory transistors 39 and 40 have respective gate widths W1 and W2, and the transfer gate transistors 41 and 42 have respective gate widths W3 and W4. In this instance, the widths W1 and W3 are in the ratio 1 : 1, and the widths W2 and W4 are in the ratio 1 : 1. Namely, the gate width ratio between the transistors 39 and 41 is 1 : 1 and the gate width ratio between the transistors 40 and 42 is 1 : 1, so that all of the transistors 39 to 42 are equal in on-resistance to one another. However each of the ratios may fall into a range between 1 : 0.8 and 1 : 1.2 in other implementations.

The row address buffer circuit 33 is coupled to the output lines 46a and the decoder circuit 34 comprises a plurality of two-input NAND circuits. Two of the NAND circuits are designated by reference numerals 46 and 47 and the two input nodes of the NAND circuit 46 are connected to two of the output lines 46a which are different in combination from those coupled to the two input nodes of the NAND circuit 47. The combination of the output lines are thus different from one another so that only one of the NAND circuits produces an output signal of the ground voltage level when a row address buffer circuit 33 stores a row address signal AX.

Figure 5:
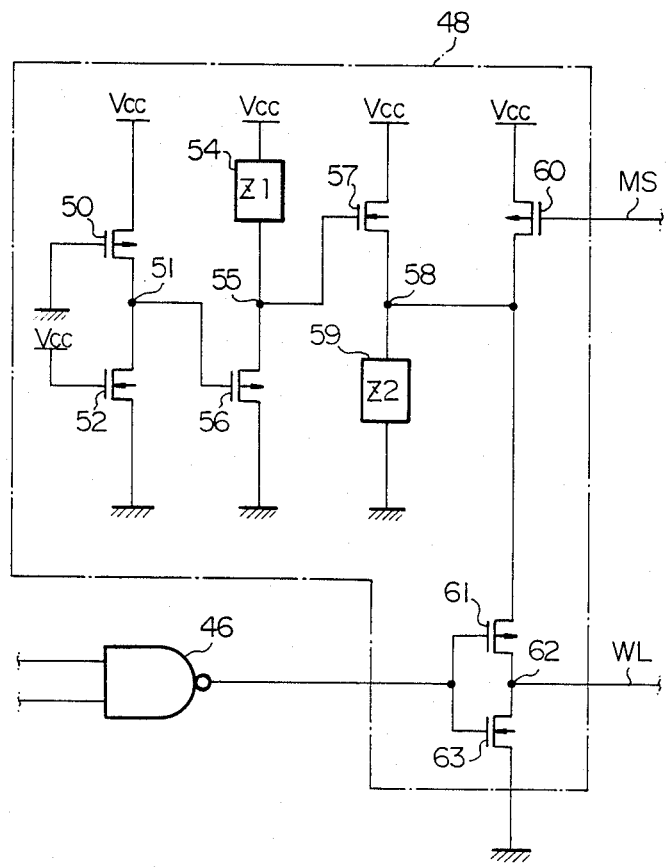
FIG. 5 is a circuit diagram showing the arrangement of the word line driving circuit incorporated in the semiconductor memory device illustrated in FIG. 3.

Turning to FIG. 5 of the drawings, a word line driving unit of the word line driving circuit 35 is illustrated. Although the word line driving circuit 35 comprises a plurality of word line driving units associated with the NAND circuits of the row address decoder circuit 34, respectively, description is made for only one word line driving unit 48 associated with the NAND circuit 46 so as to avoid repetition. The word line driving unit 48 comprises first, second, third and fourth stages each coupled between the source of positive voltage Vcc and the ground terminal. The first stage comprises a series combination of a first p-channel type MOS field effect transistor 50, a first intermediate node 51 and a first n-channel type MOS field effect transistor 52, and the MOS field effect transistors 50 and 52 have respective gate electrodes coupled to the ground terminal and the source of positive voltage Vcc. The MOS field effect transistors 50 and 52 have respective channel conductances $g_{m1}$ and $g_{m2}$ equal in value to each other, so that the voltage level VR1 at the first intermediate node 51 is given by equation 1:

$$VR1 = g_{m1}/(g_{m1}+g_{m2}) \qquad \text{(Eq. 1)}$$

The second stage comprises a first high impedance element 54, a second intermediate node 55 and a second p-channel type MOS field effect transistor 56 which are coupled in series, and the MOS field effect transistor 56 has a gate electrode coupled to the first intermediate node 51. On the other hand, the third stage has a series combination of a second n-channel type MOS field effect transistor 57, a third intermediate node 58 and a second high impedance element 59, and the MOS field effect transistor 57 has a gate electrode coupled to the second intermediate node 55. In this instance, the threshold voltage levels Vtp and Vtn of the MOS field effect transistors 56 and 57 are $$|Vtp| = Vtn \qquad \text{(Eq. 2)}$$

The first and second high impedance elements 54 and 59 have respective resistance values Z1 and Z2 which are $$Z1 \gg 1/g_{m3} \qquad \text{(Eq. 3)}$$

$$Z2 \gg 1/g_{m4} \qquad \text{(Eq. 4)}$$

where $g_{m3}$ and $g_{m4}$ are respective channel conductances of the MOS field effect transistors 56 and 57. The voltage level VR2 at the third intermediate node 58 is given by equation 5:

$$VR2 = VR1 + |Vtp| - Vtn \qquad \text{(Eq. 5)}$$

From equation 1 to equation 5, the voltage level VR2 at the third intermediate node 58 is $$VR2 = Vcc/2 \qquad \text{(Eq. 6)}$$

The fourth stage comprises a third p-channel type MOS field effect transistor 60 having a source-drain path coupled between the source of positive voltage Vcc and the third intermediate node 58, and a series combination of a fourth p-channel type MOS field effect transistor 61, a fourth intermediate node 62 and a third n-channel type MOS field effect transistor 63 coupled between the third intermediate node 58 and the ground terminal. The p-channel type MOS field effect transistor 60 has a gate electrode to which a mode signal MS is applied. The mode signal MS is produced by a control circuit 64 (see FIG. 3) and has the positive high voltage level Vcc in the read-out mode or the ground level in the write-in mode. When the mode signal MS has the positive high voltage level Vcc representing the read-out mode, the p-channel type MOS field effect transistor 60 is turned off to block the source-drain path thereof. This results in that the third intermediate node 58 has the voltage level of Vcc/2. On the other hand, when the mode signal MS has the ground level representing the write-in mode, the p-channel type MOS field effect transistor 60 turns on to provide the source-drain path between the source of positive voltage Vcc and the third intermediate node 58. Then, the voltage level at the third intermediate node 58 goes up to the positive high voltage level Vcc. The MOS field effect transistors 61 and 63 have respective gate electrodes commonly coupled to the output node of the NAND circuit 46 so that the p-channel type MOS field effect transistor 61 turns on to allow the source-drain path thereof to propagate the voltage level at the third intermediate node 58 to the fourth intermediate node 62. On the other hand, when the output node of the NAND circuit 46 goes up to the positive high voltage level Vcc, the fourth intermediate node 62 is coupled to the ground terminal through the n-channel type MOS field effect transistor 63. The fourth intermediate node 62 is coupled to the word line WL1 so that the word line driving unit 40 produces the first activation signal of the positive high voltage level Vcc and the second activation signal of a half of the positive high voltage level Vcc/2 based on the voltage level at the third intermediate node 58.

Turning back to FIG. 3, the semiconductor memory device embodying the present invention further comprises a column address buffer circuit 66 temporarily storing a column address signal AY consisting of a plurality of bits, a column address decoder circuit 67 decoding the column address signal AY supplied from the column address buffer circuit 66, and a plurality of bit line pairs, each consisting of a bit line and a complementary bit line, and extending in a column direction. Although many bit line pairs are provided in the semiconductor memory device, only two of them are shown in FIG. 3 and labeled as D0 and DB0 and D1 and DB1. The bit lines D0 and DB0 are coupled at one of their ends to the source of positive voltage Vcc through load resistors 68 and 69, respectively, and at the other ends thereof to a pair of data lines DL and DBL through respective source-drain paths of transfer gate transistors 70 and 71 respectively, and, similarly, the bit lines D1 and DB1 are coupled at one of the ends thereof to the source of positive voltage Vcc through load resistors 72 and 73, respectively, and at the other ends thereof to the data lines DL and DBL through respective source-drawn paths of transfer gate transistors 74 and 75, respectively. In this instance, all of the transfer gate transistors 70, 71, 74 and 75 are formed by n-channel type MOS field effect transistors. The data lines DL and DBL are coupled to a write-in circuit 76 and a read-out circuit 77 which in turn are respectively coupled to a data input terminal 78 and a data output terminal 79. The write-in circuit 76 and the read-out circuit 77 are selectively activated by the control circuit 64 depending upon the voltage level of a write enable signal WE. Though not shown in the drawings, the read-out circuit 77 has a sense amplifier circuit which is operative to increase the difference in voltage level between the data line DL and DBL. As described hereinbefore, the word line driving units change the output voltage level in response to the mode signal MS. The mode signal MS is produced by the control circuit 64 based on the write enable signal WE.

The column address buffer circuit 66 has a plurality of output lines 80 and the column address decoder circuit 67 comprises a plurality of two-input NAND circuits and a plurality of inverter circuits coupled to the NAND circuits, respectively. Each of the NAND circuits has two input nodes selectively coupled to two of the output lines 80 and the combination of the two output lines is different from one another, so that one of the NAND circuits produces the output signal of the ground level when a column address signal is stored in the column address buffer circuit 66. In FIG. 3, only two NAND circuits and two inverter circuits associated with the NAND circuits are shown and designated by reference numerals 81, 82, 83 and 84, respectively.

Figure 6:
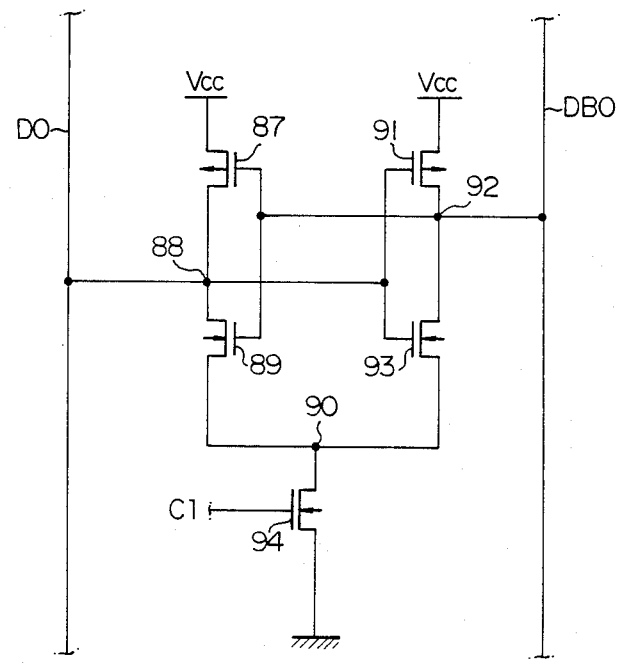
FIG. 6 is a circuit diagram showing the arrangement of the data latch circuit incorporated in the semiconductor device illustrated in FIG. 3.

The semiconductor memory device illustrated in FIG. 3 further comprises a plurality of data latch circuits and two of them are designated by reference numerals 85 and 86. All of the data latch circuits are similar in circuit arrangement to one another so that description is made for the data latch circuit 85, only. Turning to FIG. 6 of the drawings, the data latch circuit 85 comprises a series combination of a fifth p-channel type MOS field effect transistor 87, a memory node 88 and a fourth n-channel type MOS field effect transistor 89 capable of providing a conduction path between the source of positive voltage Vcc and a common node 90, a series combination of a sixth p-channel type MOS field effect transistor 91, a memory node 92 and a fifth n-channel type MOS field effect transistor 93 capable of providing a conduction path between the source of positive voltage Vcc and the common node 90, and a sixth n-channel type MOS field effect transistor 94. The memory node 88 is coupled to the bit line D0 and, on the other hand, the memory node 92 is coupled to the complementary bit line DB0. The sixth n-channel type MOS field effect transistor 94, has a gate electrode for receiving an activation signal C1. The activation signal C1 is produced by a data latch selecting circuit 95 (which is shown in FIG. 3) based on the mode signal MS and the output signal of the inverter circuit 83. The data latch circuit 86 is also associated with a data latch selecting circuit 96 which produces an activation signal C2 based on the mode signal MS and the output signal of the inverter circuit 84. The data latch circuit 85 is activated by the activation signal C1 applied to the gate electrode of the n-channel type MOS field effect transistor 94. Gate electrodes of the two MOS field effect transistors 87 and 89 are commonly coupled to the memory node 92 so the the p-channel type MOS field effect transistor 87 and the n-channel type MOS field effect transistor 89 are complementarily shifted between on-state and off-state depending upon the voltage level of the complementary bit line DB0 when the data latch circuit 85 is activated. Similarly, gate electrodes of the two MOS field effect transistors 91 and 93 are commonly coupled to the memory node 88 so that the p-channel type MOS field effect transistor 91 and the n-channel type MOS field effect transistor 93 are complementarily shifted between on-state and off-state depending upon the voltage level of the bit line D0 when the data latch circuit 85 is activated.

Description will now be made of the operation in both the read-out mode and the write-in mode with reference to FIG. 7. When an external device such as a microprocessor (not shown) needs to access the data bit stored in the memory cell 36, the microprocessor supplies the write enable signal WE of the positive high voltage level, then the mode signal MS is in the positive high voltage level Vcc and the data latch selecting circuits 95 and 96 produce no activation signal. Subsequently, a column address signal AY specifying the bit line pair D0 and DB0 is supplied from the microprocessor to the column address buffer circuit 66 and the column address signal AY stored in the buffer circuit 66 is transferred to the column address decoder circuit 67 at time T1. When the column address signal AY is decoded, the NAND circuit 83 produces the output signal of the ground voltage level which is inverted by the inverter circuit 83. Then, the transfer gate transistors 70 and 71 turn on to couple the bit line pair D0 and DB0 to the data lines DL and DBL. However, the other transfer gate transistors are turned off so that the data bits on the data lines DL and DBL can not be transferred to the other bit line pairs At time T2, a row address signal AX specifying the word line WL1 is supplied from the microprocessor to the row address buffer circuit 33 and the row address buffer circuit 33 stores the row address signal AX which in turn is supplied to the row address decoder circuit 34. With the row address signal AX specifying the word line WL1, the NAND circuit 46 of the row address decoder circuit 34 produces the output signal of the active ground voltage level but the other NAND circuits cause the output signals to remain in the positive high voltage level. With the output signal of the NAND circuit 46 of the active ground voltage level, the p-channel type MOS field effect transistor 61 of the word line driving unit 48 turns on to provide the source-drain path between the third intermediate node 58 and the fourth intermediate node 62 but the n-channel type MOS field effect transistor 63 turns off to block the source-drain path between the fourth intermediate node 62 and the ground terminal. However, the other word line driving units cause the other word lines to remain at ground voltage level. As previously described, the mode signal MS is in the positive high voltage level Vcc, so that the third p-channel MOS field effect transistor 60 is turned off. Then, the voltage level VR2 at the third intermediate node 58 is transferred through the source-drain path of the p-channel type MOS field effect transistor 61 to the word line WL1 so as to supply the word line WL1 with the second activation signal of Vcc/2. When the second activation signal of Vcc/2 is supplied to the word line WL1, the transfer gate transistors 41 and 42 of the memory cell 36 and the other transfer gate transistors of the memory cells coupled to the word line WL1 turn on to transfer the data bits from the memory nodes to the bit line pairs D0 and DB0, D1 and DB1 and so on. Thus, the word line WL1 goes up to a half of the positive high voltage level Vcc/2, and data bits stored in the memory cells coupled to the word line WL1 are not destroyed even if the memory transistors have the narrow gate electrodes in comparison with those in the prior-art semiconductor memory device. The word line WL1 goes up to a half of the positive high voltage level Vcc so that the difference in voltage level appearing on the bit line pair D0 and DB0 is relatively small. However, the small difference in voltage is increased by the sense amplifier circuit incorporated in the read-out circuit 77. The activation signals C1 and C2 are at ground level, so that the data latch circuits are not activated. The transfer gate transistors 70 and 71 are turned on to transfer the data bit on the bit line pair D0 and DB0 to the data lines DL and DBL. However, the other transfer gate transistors are turned off, so that the data bits on the other bit line pairs are not transferred to the data lines DL and DBL. In the read-out mode, the control circuit 64 activates the read-out circuit 77 so that the data bit in the form of complementary voltage levels are judged and delivered to the data output terminal 79.

On the other hand, when the microprocessor rewrites the data bit stored in the memory cell 36, the write enable signal WE of the active low level is supplied to the control circuit 64 at time T3, so that the write-in circuit 76 is activated and the control circuit 64 allows the mode signal MS to go down to ground level. The column address signal AY specifying the bit line pair D0 and DB0 is supplied to the column address buffer circuit 66 which transfers the column address signal AY to the column address decoder circuit 67. With the column address signal specifying the bit line pair D0 and DB0, the NAND circuit 81 produces an output signal at ground level which is inverted into the positive high voltage level Vcc by the inverter circuit 83. However, the other NAND circuits have the respective output signals of the positive high voltage level and the inverter circuits associated with the other NAND circuits produce the respective output signals at ground voltage level which cause the transfer gate transistors including the transfer gate transistors 74 and 75 to turn off. As the mode signal MS at ground voltage level has been supplied to the data latch selecting circuits 95, 96 and so on, the data latch selecting circuits except for the data latch selecting circuit 95 produce the activation signals of the positive high voltage level Vcc. This means that the data latch circuits except for the data latch circuit 85 are activated to be capable of storing the data bits appearing on the bit line pairs coupled thereto. With the mode signal MS of the ground voltage level, the third p-channel type MOS field effect transistor 60 turns on to provide the source-drain path between the source of positive voltage Vcc and the third intermediate node 58. At time T4, the row address signal AX specifying the word line WL1 is supplied from the microprocessor to the row address buffer circuit 33. The row address signal AX stored in the buffer circuit 33 is decoded by the row address decoder circuit 34 and the NAND circuit 46 produces the output signal of the ground voltage level but the other NAND circuits have the respective output signals of the positive high voltage level. With the mode signal MS of the ground voltage level, the third p-channel type MOS field effect transistor 60 has turned on to provide the source-drain path between the source of positive voltage level Vcc and the third intermediate node 58. In this situation, the output signal of the ground voltage level is supplied from the NAND circuit 46 to the series combination of the p-channel type MOS field effect transistor 61 and the n-channel type MOS field effect transistor 63, so that the n-channel type MOS field effect transistor 63 turns off but the p-channel type MOS field effect transistor 61 turns on to provide the source-drain path between the third intermediate node 58 and the word line WL1. A current is supplied from the source of positive voltage Vcc to the word line WL1 through the p-channel type MOS field effect transistor 61, then the voltage level on the word line WL1 rises toward the positive high voltage level Vcc. When the voltage level on the word line WL1 reaches a half of the positive high voltage level Vcc/2, the data bits stored in the memory cells coupled to the word line WL1 are read out to the respective bit line pairs. Then, the data bits except for that on the bit line pair D0 and DB0 are stored in the respective data latch circuits. After the word line WL1 reaches the positive high voltage level Vcc, a new data bit is supplied from the microprocessor to the data input terminal 78 and the new data bit is coverted to complementary voltage levels by the write-in circuit 76. The complementary voltage levels representing the new data bit are transferred from the data lines DL and DBL to the bit line pair D0 and DB0 through the n-channel type MOS field effect transistors 70 and 71. The transfer gate transistors 41 and 42 are turned on with the word line WL1 the positive high voltage level Vcc, so that the new data bit reaches the memory nodes 43 and 44 which cause the memory transistors 39 and 40 to shift between the on-state and off-state if the new data bit is different in logic level from the previous data bit. In the write-in mode, the word line driving circuit 35 allows the word line WL1 to go up to the positive high voltage level Vcc so that tho write-in operation is quickly completed. Moreover, the data bits stored in the memory cells except for the memory cell 36 have been stored in the respective data latch circuits, so that the data bits are precisely retrieved by transferring the data bits from the data latch circuit to the memory cells even if the positive high voltage level Vcc destroys the data bit in the memory nodes.

Second Embodiment

Figure 8A:
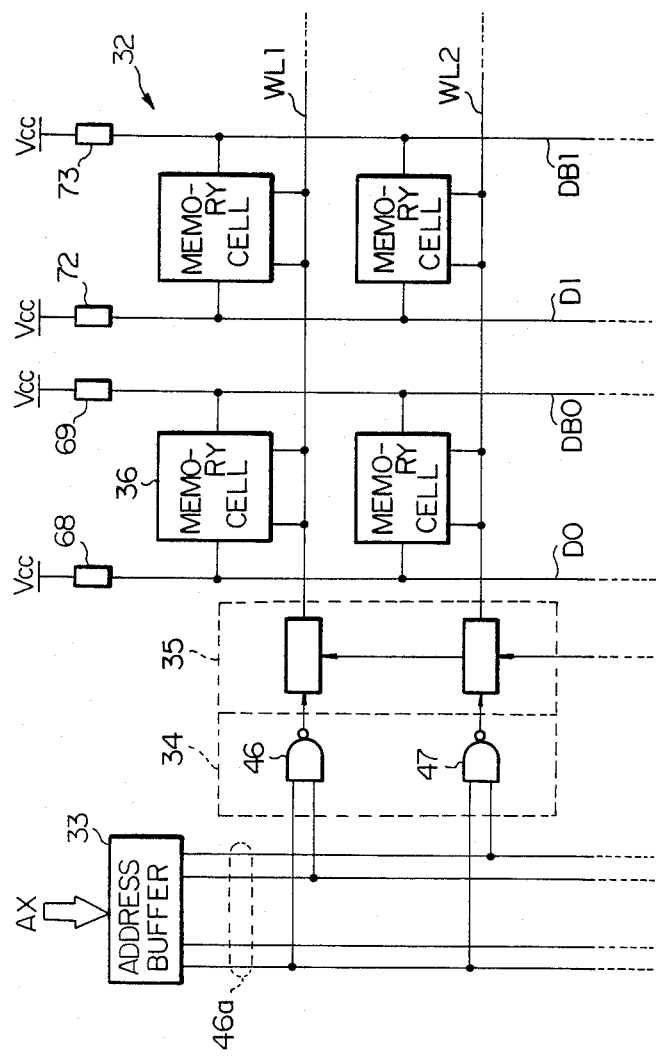
FIGS. 8A and 8B are block diagrams showing the arrangement of another semiconductor memory device embodying the present invention.
Figure 8B:
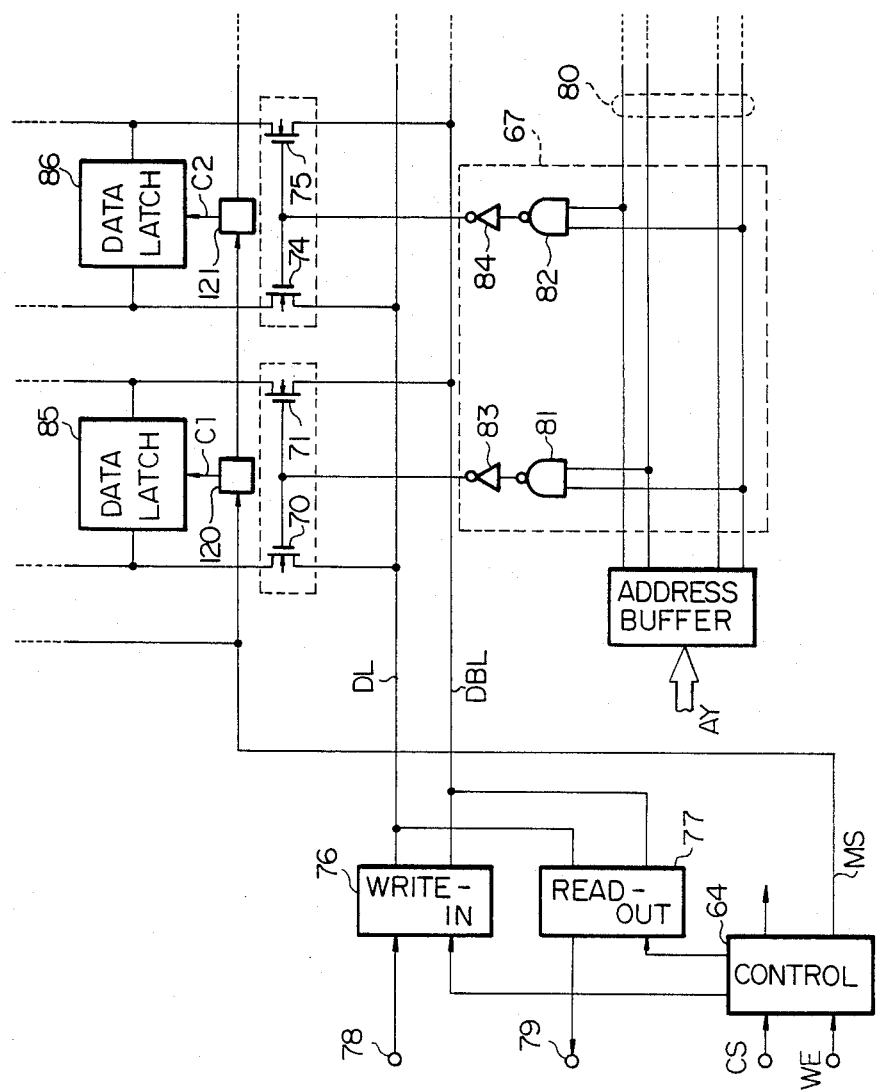

Referring to FIGS. 8A and 8B of the drawings, there is shown the circuit arrangement of another semiconductor memory device embodying the present invention. The semiconductor memory device illustrated in FIGS. 8A and 8B is essentially similar in circuit arrangement to the semiconductor memory device illustrated in FIG. 3 except for the data latch selecting circuits 95 and 96, so that circuits and component elements corresponding to those of the semiconductor memory device illustrated in FIG. 3 are designated by like reference numerals for the sake of simplicity. Differences between the semiconductor memory devices illustrated in FIGS. 8A and 8B and FIG. 3 reside in data latch activation circuits 120 and 121. The data latch activation circuits 120 and 121 produce activation signals in the presence of the mode signal MS. Then, all of the data bits appearing on the respective bit lines are latched by the associated data latch circuits 85 and 86. Operations are similar to that of the semiconductor memory device illustrated in FIG. 3 except for the data latch functions described above so that the detailed description for the operation is omitted for the sake of the simplicity.

Although particular embodiments of the present invention have been shown and described, it will be obvious to those skilled in the art that various changes and modifications may be made without departing from the spirit and scope of the present invention.

What is claimed is:

1. A semiconductor memory device fabricated on a semiconductor substrate and having operation modes consisting of a read-out mode and a write-in mode, comprising:

(a) a plurality of word lines each extending in a row direction;

(b) a plurality of bit lines each extending in a column direction;

(c) a plurality of complementary bit lines extending in a column direction and respectively paired with said bit lines to form a plurality of bit line pairs;

(d) a memory cell array having a plurality of memory cells arranged in rows and columns, each of said memory cells having first and second memory nodes were a data bit is stored in the form of complementary voltage levels, two transfer gate transistors having source-drain paths respectively coupled between the first and second memory nodes and one of said bit line pairs and gate electrodes coupled to one of said word lines, and a data bit retaining circuit operative to retain said data bit stored in said first and second memory nodes;

(e) a word line decoder circuit operative to select one word line based on a row address signal for allowing data bits stored in said memory coupled to said one word line to be transferred to said bit line pairs, respectively, in said read-out mode, said one word line further allowing data bits on said bit line pairs to be memorized in said memory cells coupled to said one word line;

(f) a word line driving circuit operative to supply said selected one word line with a relatively high voltage level or a relatively low voltage level depending upon said operation modes, said relatively high voltage level being produced in said write-in mode, said relatively low voltage level being produced in said read-out mode;

(g) data input/output means to which or from which a data bit is supplied;

(h) a bit line pair decoder circuit operative to select one bit line pair for allowing said selected one bit line pair to electrically connect to said data input-/output means, (i) a control circuit operative to produce a mode signal representing said read-out mode or said write-in mode;

(j) a plurality of data latch circuits respectively coupled to said bit line pairs and operative to latch data bits on said bit line pairs, respectively, when said data latch circuits are activated; and (k) activation means operative to activate said data latch circuits in said write-mode, except for the data latch circuit coupled to said bit line pair selected by said bit line pair decoder.

2. A semiconductor memory device as set forth in claim 1, in which said word line driving circuit supplies said selected one word line with a predetermined voltage level in said write-in mode and a half of said predetermined voltage level in said read-out mode.

3. A semiconductor memory device as set forth in claim 1, in which said data bit retaining circuit comprises first and second resistors coupled between said first and second memory nodes and a first constant voltage source respectively, and two memory transistors one of which has a source-drain path coupled between said first memory node and a second constant voltage source different in voltage level from the first constant voltage source and a gate electrode coupled to said second memory node and the other of which has a source-drain path coupled between said second memory node and the second constant voltage source and a gate electrode coupled to said first memory node.

4. A semiconductor memory device as set forth in claim 3, in which each of said transfer gate transistors has a first gate width and each of said memory transistors has a second gate width, wherein said first gate width and said second gate width are in a ratio ranging from 1 : 0.8 to 1 : 1.2.

5. A semiconductor memory device fabricated on a semiconductor substrate and having operation modes consisting of a read-out mode and a write-in mode, comprising:
(a) a plurality of word lines each extending in a row direction;
(b) a plurality of bit lines each extending in a column direction;
(c) a plurality of complementary bit lines extending in a column direction and respectively paired with said bit lines to form a plurality of bit line pairs;
(d) a source of positive voltage producing a positive voltage level;
(e) a ground terminal of an approximate ground voltage level;
(f) a memory cell array having a plurality of memory cells arranged in rows and columns, each of said memory cells having first and second memory nodes where a data bit is stored in the form of complementary voltage levels, two n-channel type transfer gate transistors having respective source-drain paths coupled between said first and second memory nodes and one of said bit line pairs and respective gate electrodes coupled to one of said word lines, two load resistors coupled between said source of positive voltage and said first and second memory nodes, and two n-channel type memory transistors having respective source-drain paths respectively coupled between said first and second memory nodes and said ground terminal, respectively, and respective gate electrodes coupled to said second and first memory nodes, respectively, a gate length of each transfer gate transistor and a gate length of each memory transistor being in a ratio ranging from 1 : 0.8 to 1 : 1.2;
(g) a word line decoder circuit having a row address buffer circuit storing a row address signal and a row decoder circuit operative to select one of said word lines based on the row address signal;
(h) a control circuit operative to produce a mode signal having the positive voltage level in said read-out mode or the approximate ground level in said write-in mode;
(i) a word line driving circuit comprising a first p-channel type field effect transistor having a source-drain path coupled between said source of positive voltage and a first intermediate node and a gate electrode coupled to said ground terminal, a first n-channel type field effect transistor having a source-drain path coupled between said first intermediate node and the ground terminal and a gate electrode coupled to said source of positive voltage, a first high resistance element coupled between said source of positive voltage and a second intermediate node, a second p-channel type field effect transistor having a source-drain path coupled between said second intermediate node and said ground terminal and a gate electrode coupled to said first intermediate node, a second n-channel type field effect transistor having a source-drain path coupled between said source of positive voltage and a third intermediate node and a gate electrode coupled to said second intermediate node, a second high resistance element coupled between said third intermediate node and said ground terminal, a third p-channel type field effect transistor having a source-drain path coupled between said source of positive voltage and said third intermediate node and a gate electrode applied with said mode signal, and a series combination of a fourth p-channel type field effect transistor, a fourth intermediate node and a third n-channel type field effect transistor capable of establishing a conduction path between said third intermediate node and said ground terminal, said fourth intermediate node coupled to one of said word lines, said fourth p-channel type field effect transistor and said third n-channel type field effect transistor having respective gate electrodes coupled to said row address decoder circuit;
(j) data input/output means from or to which data is supplied;
(k) a bit line pair decoder circuit having a column address buffer circuit storing a column address signal and a column address decoder circuit operative to select one bit line pair based on the column address signal for allowing said selected one bit line pair to electrically connect to said data input/output means;
(l) a plurality of data latch circuits each having a series combination of a fifth p-channel field effect transistor, a fifth intermediate node and a fourth n-channel field effect transistor capable of providing a conduction path coupled between said source of positive voltage and common node, a series combination of a sixth p-channel field effect transistor, a sixth intermediate node a fifth n-channel type field effect transistor capable of providing a conduction path between said source of positive voltage source of said common node, and a sixth n-channel type field effect transistor having a source-drain path coupled between said common node and said ground terminal and a gate electrode applied with an activation signal; and
(m) a latch selecting circuit operative to produce said activation signal of the positive voltage level in said write-in mode and supply said data latch circuits with the activation signal of the positive voltage level except for the data latch circuit coupled to the bit line pair specified by said bit line pair decoder circuit.

6. A semiconductor memory device comprising:
(a) a memory cell array having a plurality of word lines, plural pairs of bit lines each extending perpendicularly to said word lines, and a plurality of memory cells of a static type;
(b) selecting means responsive to an address signal and operative to activate one of said word lines and select one of said plural pairs of bit lines for specifying one of said memory cells located at the crossing point of said one of said word lines and said one of said plural pairs of bit lines, said selecting means having means operative to provide a certain voltage level with a first amplitude to said one of said word lines in a data read-out mode and to provide another voltage level with a second amplitude larger than the first amplitude to said one of said word lines in a data write-in mode for activation thereof, said certain voltage level being kept at said first amplitude in said data read-out mode; and
(c) data latch means coupled to said plural pairs of bit lines, said data latch means remaining in an inactive state in said read-out mode, said data latch means being selectively activated in said data write-in mode, for storing respective data bits in memory cells coupled to said activated one of said word lines, except for the data latch circuit coupled to the bit line pair selected by said selecting means.

7. A semiconductor memory device fabricated on a semiconductor substrate and having operation modes consisting of a read-out mode and a write-in mode, comprising:
(a) a plurality of word lines each extending in a row direction;
(b) a plurality of bit lines each extending in a column direction;
(c) a plurality of complementary bit lines extending in a column direction and respectively paired with said bit lines to form a plurality of bit line pairs;
(d) a memory cell array having a plurality of memory cells arranged in rows and columns, each of said memory cells having first and second memory nodes where a data bit is stored in the form of complementary voltage levels, two transfer gate transistors having source-drain paths respectively coupled between the first and second memory nodes and one of said bit line pairs and gate electrodes coupled to one of said word lines, and a data bit retaining circuit operative to retain said data bit stored in said first and second memory nodes;
(e) a word line decoder circuit operative to select one word line based on a row address signal;
(f) a word line driving circuit operative to supply said one word line with a relatively high voltage level or a relatively low voltage level depending upon said operation modes, said relatively high voltage level being produced in said write-in mode, said relatively low voltage level being produced in said read-out mode;
(g) data input/output means to which or from which a data bit is supplied;
(h) a bit line pair decoder circuit operative to select one bit line pair for allowing said selected one bit line pair to electrically connect to said data input/output means, and
(i) a control circuit operative to produce a mode signal representing said read-out mode or said write-in mode,
wherein said word line driving circuit supplies said selected word line with a predetermined voltage level in said write-in mode and a half of said predetermined voltage level in said read-out mode, and
wherein each of said word line driving circuits comprises a first p-channel type field effect transistor having a source-drain path coupled between a source of positive voltage and a first intermediate node and a gate electrode coupled to a ground terminal, a first n-channel type field effect transistor having a source-drain path coupled between said first intermediate node and the ground terminal and a gate electrode coupled to said source of positive voltage, a first high resistance element coupled between said source of positive voltage and a second intermediate node, a second p-channel type field effect transistor having a source-drain path coupled between said second intermediate node and said ground terminal and a gate electrode coupled to said first intermediate node, a second n-channel type field effect transistor having a source-drain path coupled between said source of positive voltage and a third intermediate node and a gate electrode coupled to said second intermediate mode, a second high resistance element coupled between said third intermediate node and said ground terminal, a third p-channel type field effect transistor having a source-drain path coupled between said source of positive voltage and said third intermediate node and a gate electrode applied with said mode signal, and a series combination of a fourth p-channel type field effect transistor, a fourth intermediate node and a third n-channel type field effect transistor capable of establishing a conduction path between said third intermediate node and said ground terminal, said fourth intermediate node coupled to one of said word lines, said fourth p-channel type field effect transistor and said third n-channel type field effect transistor having respective gate electrodes coupled to said word line decoder circuit.

8. A semiconductor memory device fabricated on a semiconductor substrate and having operation modes consisting of a read-out mode and a write-in mode, comprising:
(a) a plurality of word lines each extending in a row direction;
(b) a plurality of bit lines each extending in a column direction;
(c) a plurality of complementary bit lines extending in a column direction and respectively paired with said bit lines to form a plurality of bit line pairs;
(d) a memory cell array having a plurality of memory cells arranged in rows and columns, each of said memory cells having first and second memory nodes where a data bit is stored in the form of complementary voltage levels, two transfer gate transistors having source-drain paths respectively coupled between the first and second memory nodes and one of said bit line pairs and gate electrodes coupled to one of said word lines, and a data bit retaining circuit operative to retain said data bit stored in said first and second memory nodes;
(e) a word line decoder circuit operative to select one word line based on a row address signal;
(f) a word line driving circuit operative to supply said selected word line with a relatively high voltage level or a relatively low voltage level depending upon said operation modes, said relatively high voltage level being produced in said write-in mode, said relatively low voltage level being produced in said read-out mode;
(g) data input/output means to which or from which a data bit is supplied;
(h) a bit line pair decoder circuit operative to select one bit line pair for allowing said selected one bit pair to electrically connect to said data input/output means, and
(i) a control circuit operative to produce a mode signal representing said read-out mode or said write-in mode,
wherein said semiconductor memory device further comprises a plurality of data latch circuits each coupled to an associated one of said bit line pairs and operative to store a data bit appearing on said associated bit line pair upon activation, and a latch selecting circuit operative to activate said data latch circuits except for the data latch circuit coupled to the bit line pair specified by said bit line pair decoder circuit.

9. A semiconductor memory device as set forth in claim 8, in which each of said data latch circuits comprises a series combination of a fifth p-channel field effect transistor, a fifth intermediate node and a fourth n-channel field effect transistor capable of providing a conduction path coupled between a source of positive voltage and a common node, a series combination of a sixth p-channel field effect transistor, a sixth intermediate node and a fifth n-channel type field effect transistor capable of providing a conduction path between said source of positive voltage and said common node, and a sixth n-channel type field effect transistor having a source-drain path coupled between said common node and a ground terminal and a gate electrode coupled to said latch selected circuit, wherein a gate electrode of said fifth p-channel field effect transistor, a gate electrode of said fourth n-channel field effect transistor and said sixth intermediate node are coupled to said complementary bit line of said associated bit line pair, and a gate electrode of sixth p-channel field effect transistor, a gate electrode of said fifth n-channel field effect transistor and a fifth intermediate node are coupled to said bit line of said associated bit line pair.

* * * * *

UNITED STATES PATENT AND TRADEMARK OFFICE
CERTIFICATE OF CORRECTION

PATENT NO. : 4,953,127

DATED : August 28, 1990

INVENTOR(S) : Yasuhiko NAGAHASHI and Yasuhiko RAI

It is certified that error appears in the above-identified patent and that said Letters Patent is hereby corrected as shown below:

Col. 3, line 60, after "bit" insert --retaining circuit operative to retain the data bit stored in the--;

Col. 3, line 66, delete "g)" and insert --(g)--.

Col. 7, line 25, delete "40" and insert --48--;

Col. 8, line 51, delete the first occurrence of "the" and insert --that--.

Col. 12, line 51, delete "said" and insert --each--.

Signed and Sealed this

Thirty-first Day of March, 1992

Attest:

HARRY F. MANBECK, JR.

*Attesting Officer*     *Commissioner of Patents and Trademarks*